(12) United States Patent
Fay

(10) Patent No.: US 11,196,142 B2
(45) Date of Patent: Dec. 7, 2021

(54) MILLIMETER WAVE ANTENNA AND EMI SHIELDING INTEGRATED WITH FAN-OUT PACKAGE

(71) Applicant: Micron Technology, Inc., Boise, ID (US)

(72) Inventor: Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 314 days.

(21) Appl. No.: 16/118,785

(22) Filed: Aug. 31, 2018

(65) Prior Publication Data

US 2020/0076052 A1 Mar. 5, 2020

(51) Int. Cl.
*H01Q 1/22* (2006.01)
*H01L 23/48* (2006.01)
*H01L 21/02* (2006.01)

(52) U.S. Cl.
CPC ..... *H01Q 1/2283* (2013.01); *H01L 21/02104* (2013.01); *H01L 23/481* (2013.01)

(58) Field of Classification Search
CPC ............ H01Q 1/22; H01L 21/02; H01L 23/48
USPC ........................................................ 343/906
See application file for complete search history.

(56) References Cited

U.S. PATENT DOCUMENTS

2018/0337148 A1* 11/2018 Baek .................. H01L 23/66

FOREIGN PATENT DOCUMENTS

| KR | 1020170062550 | * | 6/2017 | ............ H01L 23/66 |
| TW | 201347103 A | | 11/2013 | |
| TW | 201813041 A | | 4/2016 | |
| TW | 201742310 A | | 12/2017 | |
| WO | 201803043 A | | 1/2018 | |
| WO | WO2018119153 A | | 6/2018 | |

OTHER PUBLICATIONS

Taiwan Patent Office; Office Action for Application No. 108130747 dated May 22, 2020.

* cited by examiner

*Primary Examiner* — Andrea Lindgren Baltzell
(74) *Attorney, Agent, or Firm* — Perkins Coie LLP

(57) ABSTRACT

Systems and methods of manufacture are disclosed for a semiconductor device assembly having a semiconductor device having a first side and a second side opposite of the first side, a mold compound region adjacent to the semiconductor device, a redistribution layer adjacent to the first side of the semiconductor device, a dielectric layer adjacent to the second side of the semiconductor device, a first via extending through the mold compound region that connects to at least one trace in the dielectric layer, and an antenna structure formed on the dielectric layer and connected to the semiconductor device through the first via.

18 Claims, 3 Drawing Sheets

MILLIMETER WAVE ANTENNA AND EMI SHIELDING INTEGRATED WITH FAN-OUT PACKAGE

FIELD OF THE DISCLOSURE

The embodiments described herein relate to millimeter wave antennas, electromagnetic interference (EMI) shielding, and, in particular integrating the same on a fan-out, or other, packaging.

BACKGROUND

As computing devices become more integrated into society, data access and mobility are becoming more important to a typical consumer. Compact wireless computing devices, such as cell phones, tablets, laptops, etc., are becoming faster, smaller, and more mobile. In order to meet the demands of new generation products, processing and memory packages within mobile devices must become faster and more compact. 5th Generation Wireless Systems (5G) provide high throughput, low latency, high mobility, and high connection density. Making use of millimeter wave bands (24-86 GHz) for mobile data communication is beneficial for producing 5G systems.

Antennas used for millimeter wave communication typically include an antenna array deposited on a printed circuit board (PCB) within a mobile device. The area, or real estate, occupied by the antennas may decrease the density of devices attached to the PCB and may result in larger, less mobile devices. Further, a horizontal millimeter wave antenna may cause interference to adjacent circuitry, over which the antenna may be deposited. These factors can make it difficult to incorporate millimeter wave antennas into mobile devices. Other issues, disadvantages, and drawbacks may exist.

Figure 1:
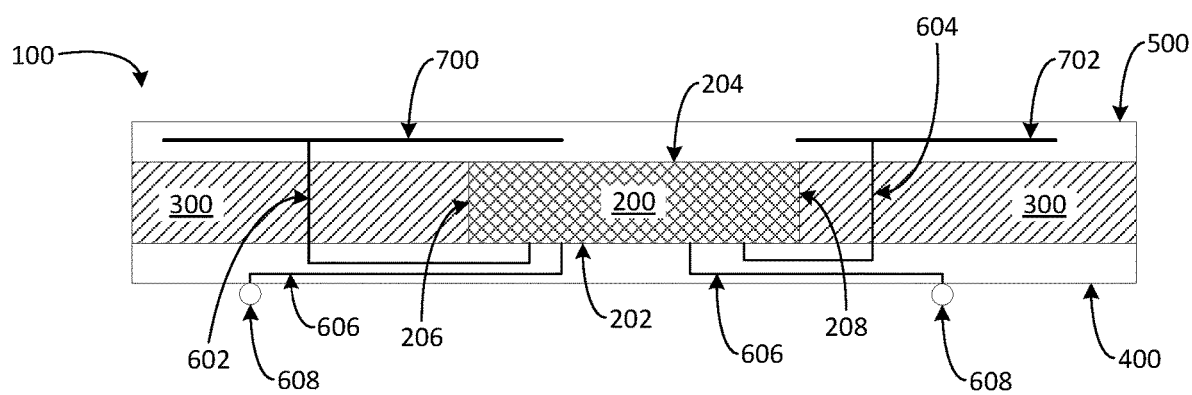
FIG. 1 is a cross-sectional side view schematic of a semiconductor device assembly incorporating integrated millimeter wave antennas in accordance with disclosed embodiments.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment a semiconductor device assembly includes a semiconductor device having a first side and a second side opposite of the first side, a mold compound region adjacent to the semiconductor device, a redistribution layer adjacent to the first side of the semiconductor device, a dielectric layer adjacent to the second side of the semiconductor device, a first via extending through the mold compound region and connected to at least one trace in the dielectric layer, and an antenna structure formed on the dielectric layer and connected to the semiconductor device through the first via. In further disclosed embodiments, the antenna structure is a 5 g millimeter wave antenna. In still further disclosed embodiments, the antenna structure is a tunable antenna. In still further disclosed embodiments, the semiconductor device assembly includes a second via extending through the mold compound region and connected to at least on trace in the dielectric layer, and a second antenna structure formed on the dielectric layer and connected to the semiconductor device through the second via.

In another disclosed embodiment, a semiconductor device assembly includes a semiconductor device having a first side, a mold compound region, a first redistribution layer adjacent to the first side of the semiconductor device, the first redistribution layer configured to connect the semiconductor device to an external device, a second redistribution layer adjacent to the first redistribution layer, and an antenna structure formed in the second redistribution layer, the semiconductor device connected to the antenna structure through the first redistribution layer.

In another disclosed embodiment, a semiconductor device assembly includes a package-on-package assembly including a first semiconductor device, at least one via, and a second semiconductor device connected to the first semiconductor device through the at least one via, and an antenna structure connected to at least one of the first semiconductor device or the second semiconductor device through the at least one via. In further disclosed embodiments, the antenna structure is located between the first semiconductor device and the second semiconductor device. In still further disclosed embodiments, the semiconductor device assembly includes a second antenna structure located on a back side of the package-on-package assembly.

In another disclosed embodiment, a semiconductor device assembly includes a semiconductor device having an active side and a back side, a mold compound region, a first redistribution layer adjacent to the back side of the semiconductor device, an electromagnetic interference (EMI) shield located in the first redistribution layer, a second redistribution layer located above the first redistribution layer, and an antenna structure formed in the second redistribution layer and connected to the semiconductor device through a via.

Also disclosed is a method for making a semiconductor device assembly, the method including molding a mold compound layer around a semiconductor device, forming a dielectric layer on top of the mold compound layer, forming an antenna structure on top of the dielectric layer, forming a via through the mold compound layer that connects to at least one trace in the dielectric layer, and connecting the antenna structure to the semiconductor device through the via. In a further embodiment, the method includes forming a second antenna structure on top of the dielectric layer, forming a second via through the mold compound layer and the dielectric layer, and connecting the second antenna structure to the semiconductor device through the second via.

FIG. 1 is a cross-sectional side view schematic of a semiconductor device assembly 100 incorporating integrated millimeter wave antennas 700, 702 in accordance with disclosed embodiments. As shown, a semiconductor device assembly 100 can have a semiconductor device 200 in a fan-out package with mold compound 300 (e.g., epoxy molding compound, or ECM) on the lateral sides 206, 208 of the semiconductor device 200. The semiconductor device 200 has an active side 202 and a back side 204. The active side 202 is connected through a first redistribution layer 400 using one or more traces, vias, or the like 606 to an interconnect such as solder balls 608 for connection to other devices. As one of ordinary skill in the art having the benefit of this disclosure would understand, the traces, vias, or the like 606 and balls 608 are merely exemplary and different amounts, locations, etc., may be used.

As also shown, embodiments may include a second dielectric, or redistribution layer 500, on the back side 204 of the semiconductor device 200 and mold compound 300 layers to contain one or more millimeter wave antenna structures 700, 702. As shown, antenna structures 700, 702 may be connected to active surface 202 through one or more vias 602, 604 that pass through the mold compound 300. As one of ordinary skill in the art having the benefit of this disclosure would understand, the vias 602, 604 and antennae 700, 702 are merely exemplary and different amounts, locations, etc., may be used.

Figure 2:
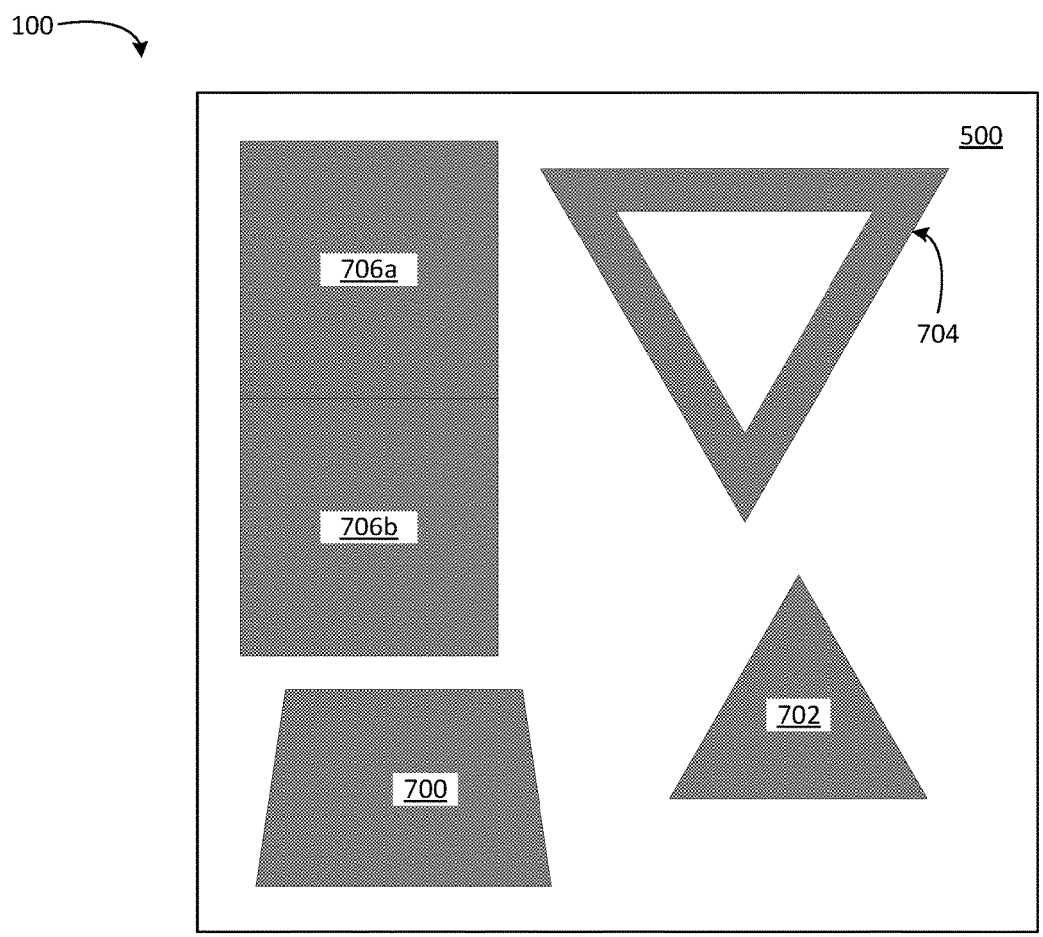
FIG. 2 is a top view schematic of a semiconductor device assembly incorporating integrated millimeter wave antennas in accordance with disclosed embodiments.

FIG. 2 is a top view schematic of a semiconductor device assembly 100 incorporating integrated millimeter wave antennas 700, 702, 704, 706a, and 706b formed in the top redistribution layer 500 in accordance with disclosed embodiments. As shown, the millimeter wave antennas 700, 702, 704, 706a, 706b may comprise any suitable shape, size, configuration, or the like in accordance with the design of the device.

As explained herein, an antenna structure 700, 702, 704, 706a, and 706b may be tuned for a particular transmission/receiver device, or radio circuitry, by any number of suitable methods. For example, different types of radio circuitry may require antennas of different sizes or shapes. By including an antenna structure such as 706a and 706b, with a separate connection to each portion 706a and 706b from the active side 202 of the semiconductor device 200, the size of the antenna may be changed (e.g., lengthened by connecting both sections 706a and 706b to the same circuitry, or shortened by connecting only one section) and the antenna may be tuned to the desired outcome. Likewise, by connecting multiple antenna structures (e.g., 702 and 704) to the same circuitry a different shape of antenna may be implemented.

In some embodiments, the semiconductor device assembly 100 may be initially manufactured with all the antenna structures (e.g., 700, 702, 704, 706a, 706b) connected to the active side 202 and by severing a connection (e.g., 602, 604) between the antenna structures, the semiconductor device assembly 100 may be customized to a particular end-user. Severing of the connections (e.g., 602, 604) may be accomplished after manufacturing by laser ablation, by including a fuse in the connection, by including a switch in the connection, by altering the circuitry, or the like.

Figure 3:
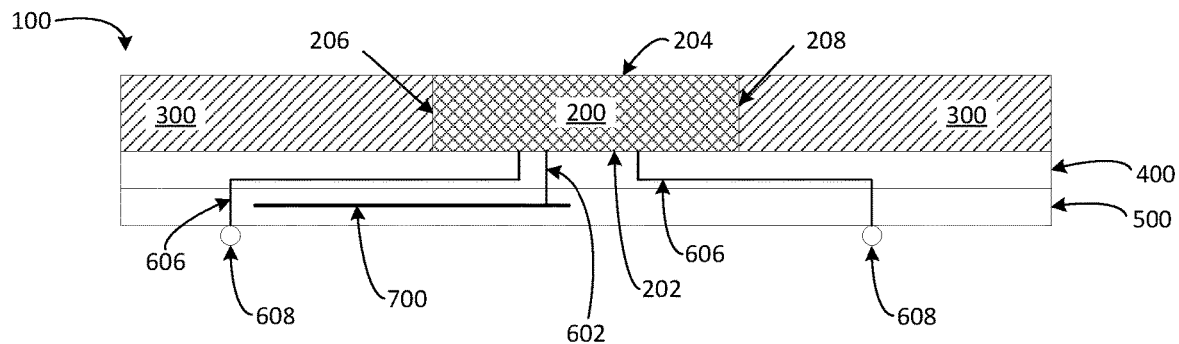
FIG. 3 is a cross-sectional side view schematic of a semiconductor device assembly incorporating integrated millimeter wave antennas in accordance with disclosed embodiments.

FIG. 3 is a cross-sectional side view schematic of a semiconductor device assembly 100 incorporating integrated millimeter wave antennas 700 on a front, or active side 202, of the semiconductor device 200 in accordance with disclosed embodiments. As shown, in these embodiments, a first redistribution layer 400 may be formed on the active side 202 of the semiconductor device 200 with traces, vias, or the like 606 to an interconnect device, such as solder balls 608. A second redistribution layer 500 may be formed on top of the first redistribution layer 400 with a millimeter wave antenna 700 and one or more traces, vias, or the like 602 to connect a millimeter wave antenna 700 to the semiconductor device 200. As one of ordinary skill in the art having the benefit of this disclosure would understand, the positions of the first redistribution layer 400 and the second redistribution layer 500 may be switched as desired.

Figure 4:
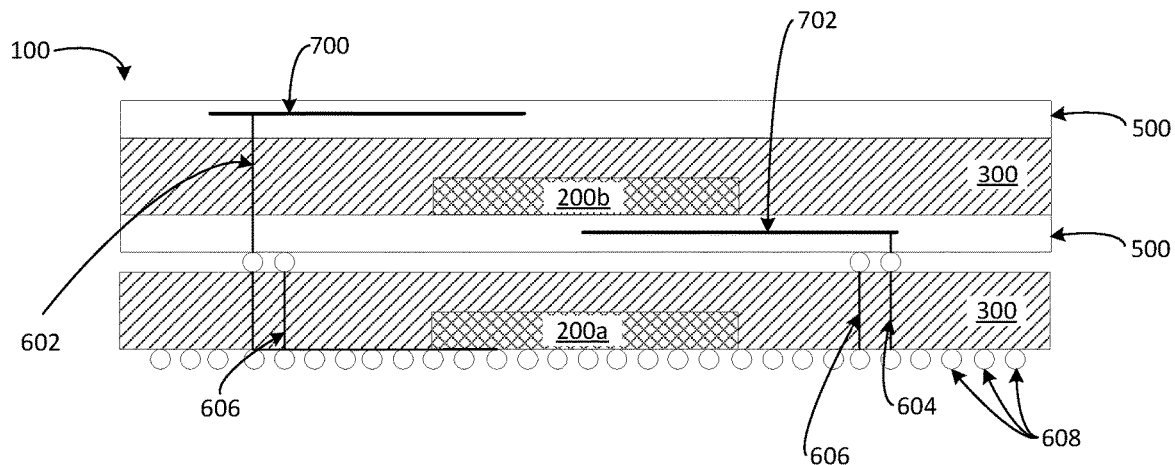
FIG. 4 is a cross-sectional side view schematic of a semiconductor device assembly incorporating integrated millimeter wave antennas on a package-on-package (POP) assembly in accordance with disclosed embodiments.

FIG. 4 is a cross-sectional side view schematic of a semiconductor device assembly 100 incorporating integrated millimeter wave antennas 700, 702 on POP configuration of a semiconductor device assembly 100 in accordance with disclosed embodiments. As shown a first semiconductor device 200a may be interconnected with a second semiconductor device 200b in a POP configuration. Multiple redistribution layers 500 may be formed on one or the other of the semiconductor devices (as shown, 200b) to contain millimeter wave antenna structures 700, 702. As one of ordinary skill in the art having the benefit of this disclosure would understand, the number and positions of the redistribution layers 500, and number and positions of antenna structures 700, 702 may be varied as desired.

Figure 5:
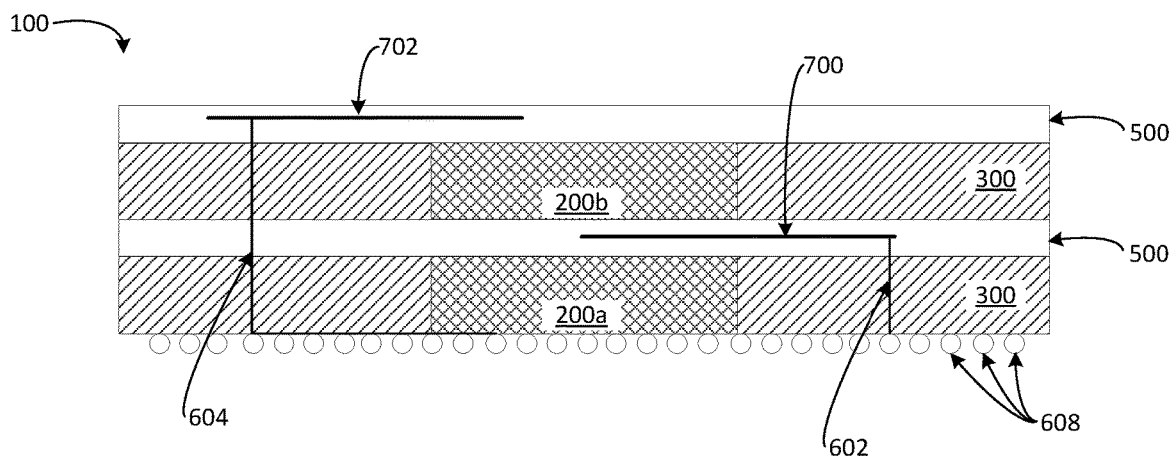
FIG. 5 is a cross-sectional side view schematic of a semiconductor device assembly incorporating integrated millimeter wave antennas on a fan-out POP assembly in accordance with disclosed embodiments.

FIG. 5 is a cross-sectional side view schematic of a semiconductor device assembly 100 incorporating integrated millimeter wave antennas 700, 702 on a fan-out, POP assembly in accordance with disclosed embodiments. As shown a first semiconductor device 200a may be interconnected with a second semiconductor device 200b in a fan-out, POP configuration. Multiple redistribution layers 500 may be formed on one or the other of the semiconductor devices (as shown, 200b) to contain millimeter wave antenna structures 700, 702. As one of ordinary skill in the art having the benefit of this disclosure would understand, the number and positions of the redistribution layers 500, and number and positions of antenna structures 700, 702 may be varied as desired.

Figure 6:
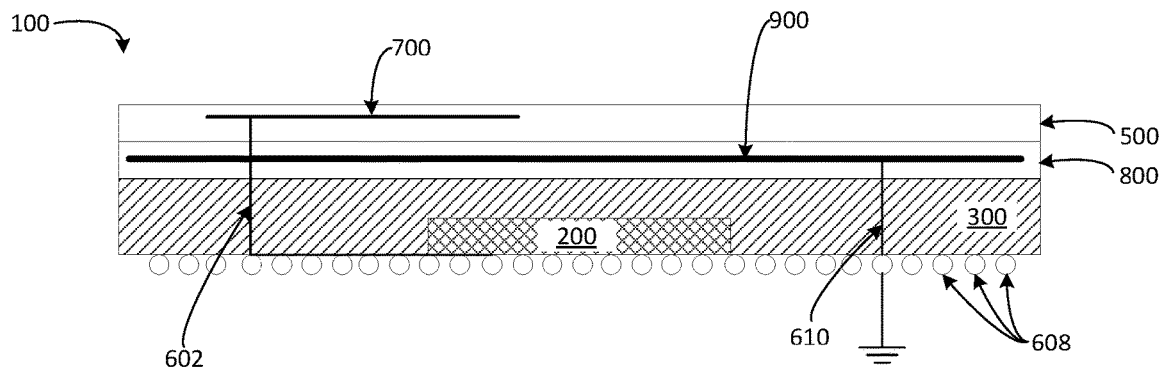
FIG. 6 is a cross-sectional side view schematic of a semiconductor device assembly incorporating integrated millimeter wave antennas and EMI shielding in accordance with disclosed embodiments.

FIG. 6 is a cross-sectional side view schematic of a semiconductor device assembly 100 incorporating integrated millimeter wave antennas 700 and EMI shielding 900 in accordance with disclosed embodiments. As shown, an EMI shielding layer 800 may be formed on a semiconductor device 200 and include an EMI shield 900 that may be connected to ground, or the like. A second redistribution layer 500 may be formed on top of the EMI shielding layer 800 to contain millimeter wave antenna 700. Among other things, the EMI shield 900 helps minimize interference of signals between the semiconductor device 200 and the antenna 700. As one of ordinary skill in the art having the benefit of this disclosure would understand, the number and positions of the layers 500, 800 and number and positions of antenna structures 700 and EMI shielding 900 may be varied as desired.

Figure 7:
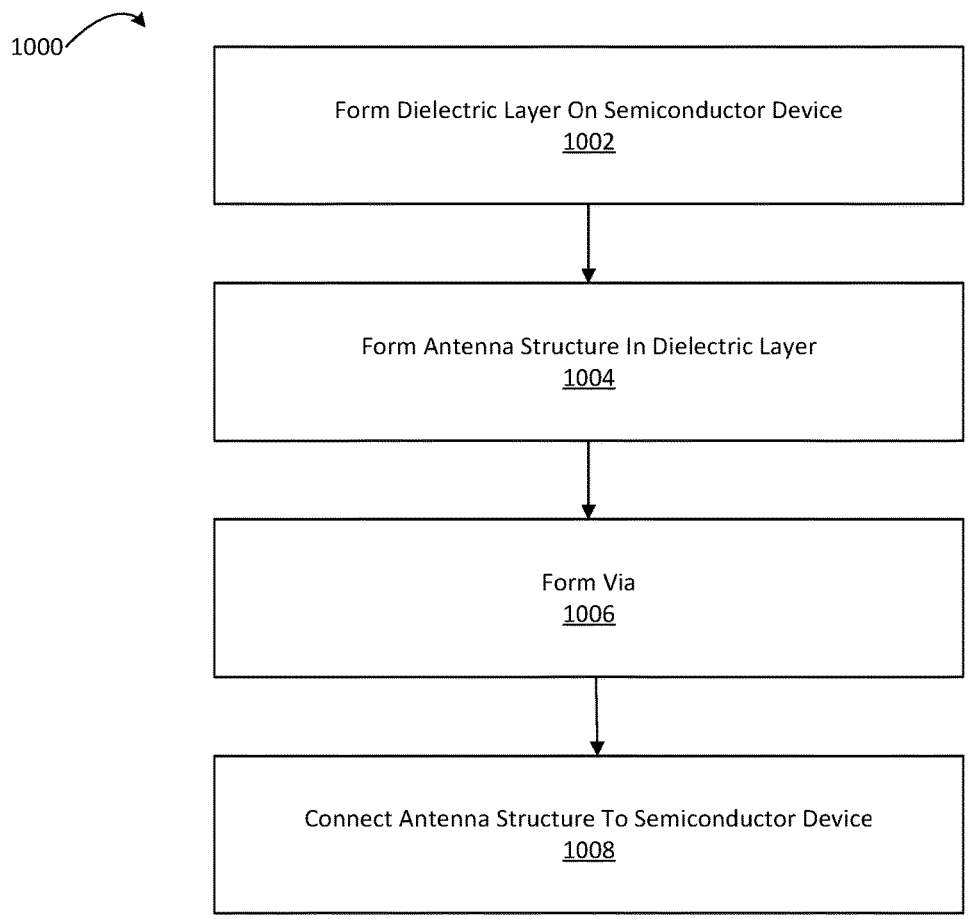
FIG. 7 is a flow chart showing a method of manufacturing a semiconductor device assembly incorporating integrated millimeter wave antennas in accordance with disclosed embodiments.

FIG. 7 is a flow chart showing an exemplary method 1000 of manufacturing a semiconductor device assembly 100 incorporating integrated millimeter wave antennas 700 in accordance with disclosed embodiments. As shown, method 1000 may include at 1002 forming one or more dielectric layers (e.g., 500) on a semiconductor device 200. At 1004 one or more antenna structures (e.g., 700) may be formed in the one or more dielectric layers. At 1006 one or more traces, vias, or the like (e.g., 602) may be formed through the one or more dielectric layers. At 1008 the one or more antenna structures (e.g., 700) may be connected to the semiconductor device 200 through the one or more traces, vias, or the like. As one of ordinary skill in the art having the benefit of this disclosure would understand, the steps of method 1000 may be executed in a different order, at different times, or steps added or removed in accordance with the various types of semiconductor device assemblies 100 as disclosed herein.

Although various embodiments have been shown and described, the present disclosure is not so limited and will be understood to include all such modifications and variations are would be apparent to one skilled in the art.

What is claimed is:

1. A semiconductor device assembly comprising:
    a semiconductor device having a first side and a second side opposite of the first side;
    a mold compound region adjacent to the semiconductor device;
    a redistribution layer adjacent to the first side of the semiconductor device;
    a dielectric layer adjacent to the second side of the semiconductor device;
    one or more vias extending through the mold compound region and connected to at least one trace in the dielectric layer;
    an antenna structure formed on the dielectric layer, the antenna structure comprising at least two portions, and each of the at least two portions are connected to a selectable connection means that is connected to the semiconductor device through the one or more vias and the size of the antenna structure changes depending upon the number of the at least two portions selected to be connected to the semiconductor device.

2. The semiconductor device assembly of claim 1 wherein the antenna structure is a 5 g millimeter wave antenna.

3. The semiconductor device assembly of claim 1 wherein the selectable connection means comprises a fuse, a switch, or a severable connection.

4. The semiconductor device assembly of claim 1 wherein the first side of the semiconductor device is a live surface of the semiconductor device.

5. The semiconductor device assembly of claim 1 further comprising:
    one or more second vias extending through the mold compound region and connected to at least one trace in the dielectric layer; and
    a second antenna structure formed on the dielectric layer and connected to the semiconductor device through the one or more second vias.

6. A semiconductor device assembly comprising:
    a semiconductor device having a first side;
    a mold compound region;
    a first redistribution layer adjacent to the first side of the semiconductor device, the first redistribution layer configured to connect the semiconductor device to an external device;
    a second redistribution layer adjacent to the first redistribution layer; and
    a plurality of antenna structures formed in the second redistribution layer, the semiconductor device connected to each of the plurality of antenna structures through the first redistribution layer and through a selectable connection means wherein each of the plurality of antenna structures is configured to be selectably disconnected from the semiconductor device to change the size of the plurality of antenna structures.

7. The semiconductor device assembly of claim 6 wherein at least one of the plurality of antenna structures is a 5 g millimeter wave antenna.

8. The semiconductor device assembly of claim 6 wherein selectable connection means comprises a fuse, a switch, or a severable connection.

9. The semiconductor device assembly of claim 6 wherein the first side of the semiconductor device is a live surface of the semiconductor device.

10. A semiconductor device assembly comprising:
a package-on-package assembly comprising:
   a first semiconductor device;
   at least one via; and
   a second semiconductor device connected to the first semiconductor device through the at least one via; and
   a plurality of antenna structures selectively connectable to at least one of the first semiconductor device or the second semiconductor device through the at least one via, wherein each of the plurality of antenna structures is configured to be selectively disconnected from the semiconductor device to change the size of the plurality of antenna structures.

11. The semiconductor device assembly of claim 10 wherein the plurality of antenna structures are located between the first semiconductor device and the second semiconductor device.

12. The semiconductor device assembly of claim 11 further comprising:
   an additional antenna structure located on a back side of the package-on-package assembly.

13. The semiconductor device assembly of claim 10 wherein the plurality of antenna structures are located on a back side of the package-on-package assembly.

14. The semiconductor device assembly of claim 10 wherein at least one of the plurality of antenna structures is a 5 g millimeter wave antenna.

15. The semiconductor device assembly of claim 10 wherein at least one of the plurality of antenna structures is a tunable antenna.

16. A semiconductor device assembly comprising:
   a semiconductor device having an active side and a back side;
   a mold compound region;
   a first redistribution layer adjacent to the back side of the semiconductor device;
   an electromagnetic interference (EMI) shield located in the first redistribution layer;
   a second redistribution layer located above the first redistribution layer; and
   an antenna structure formed in the second redistribution layer the antenna structure comprising at least two portions and each of the at least two portions are connected to a selectable connection means that is connected to the semiconductor device through a via and the size of the antenna structure changes depending upon the number of the at least two portions selected to be connected to the semiconductor device.

17. The semiconductor device assembly of claim 16 wherein the antenna structure is a 5 g millimeter wave antenna.

18. The semiconductor device assembly of claim 16 wherein the selectable connection means comprises a fuse, a switch, or a severable connection.

* * * * *